United States Patent
Jang et al.

(10) Patent No.: US 9,245,995 B2
(45) Date of Patent: Jan. 26, 2016

(54) SEMICONDUCTOR DEVICE HAVING POWER METAL-OXIDE-SEMICONDUCTOR TRANSISTOR

(71) Applicant: SAMSUNG ELECTRONICS CO., LTD., Suwon-si, Gyeonggi-do (KR)

(72) Inventors: Jae-june Jang, Hwaseong-si (KR); Kyu-heon Cho, Seoul (KR); Min-hwan Kim, Hwaseong-si (KR); Dong-eun Jang, Seoul (KR); Hoon Chang, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 53 days.

(21) Appl. No.: 13/921,412

(22) Filed: Jun. 19, 2013

(65) Prior Publication Data

US 2013/0341714 A1    Dec. 26, 2013

(30) Foreign Application Priority Data

Jun. 20, 2012   (KR) ........................ 10-2012-0066315

(51) Int. Cl.
| | |
|---|---|
| *H01L 29/78* | (2006.01) |
| *H01L 29/40* | (2006.01) |
| *H01L 29/423* | (2006.01) |
| *H01L 29/66* | (2006.01) |
| *H01L 29/06* | (2006.01) |
| *H01L 29/49* | (2006.01) |
| *H01L 29/08* | (2006.01) |

(52) U.S. Cl.
CPC ........ *H01L 29/7816* (2013.01); *H01L 29/0653* (2013.01); *H01L 29/402* (2013.01); *H01L 29/4238* (2013.01); *H01L 29/66681* (2013.01); *H01L 29/0878* (2013.01); *H01L 29/4983* (2013.01)

(58) Field of Classification Search
CPC ........................ H01L 29/7835; H01L 29/1095
USPC .......................................................... 257/335
See application file for complete search history.

(56) References Cited

U.S. PATENT DOCUMENTS

| | | | |
|---|---|---|---|
| 7,888,732 B2 | 2/2011 | Denison et al. | |
| 7,981,783 B2 * | 7/2011 | Lee ............................... | 438/526 |
| 8,304,835 B2 * | 11/2012 | Bulucea et al. ............... | 257/368 |
| 2010/0006937 A1 | 1/2010 | Lee | |
| 2010/0102386 A1 | 4/2010 | You | |

FOREIGN PATENT DOCUMENTS

KR    10-2011-0078621 A    7/2011

* cited by examiner

*Primary Examiner* — Fernando L Toledo
*Assistant Examiner* — Neil Prasad
(74) *Attorney, Agent, or Firm* — Lee & Morse, P.C.

(57) ABSTRACT

A semiconductor device includes a power metal-oxide-semiconductor (MOS) transistor including a semiconductor substrate, an impurity region on the semiconductor substrate, the impurity region having a first conductivity, a drift region in the impurity region, the drift region having the first conductivity, a body region in the impurity region adjacent to the drift region, the body region having a second conductivity different from the first conductivity, a drain extension insulating layer on the drift region, a gate insulating layer and a gate electrode sequentially stacked across a portion of the body region and a portion of the drift region, a drain extension electrode on the drain extension insulating layer, a drain region contacting a side of the drift region opposite to the body region, the drain region having the first conductivity, and a source region in the body region, the source region having the second conductivity.

20 Claims, 10 Drawing Sheets

SEMICONDUCTOR DEVICE HAVING POWER METAL-OXIDE-SEMICONDUCTOR TRANSISTOR

CROSS-REFERENCE TO RELATED APPLICATION

Korean Patent Application No. 10-2012-0066315, filed on Jun. 20, 2012, in the Korean Intellectual Property Office, and entitled: "Semiconductor Device Having Power Metal-Oxide-Semiconductor Transistor," is incorporated by reference herein in its entirety.

BACKGROUND

1. Field

Embodiments relate to a semiconductor device having a power metal-oxide-semiconductor (MOS) transistor.

2. Description of the Related Art

Due to rapid development of the electronic industry and increased user demands, electronic devices are getting smaller, lighter, and more multifunctional. As such, there has been an increase in forming power MOS transistors as a separate device (chip), integrally with an integrated circuit for controlling power.

SUMMARY

Embodiments are directed to a semiconductor device comprising a power metal-oxide-semiconductor (MOS) transistor. The MOS transistor includes a semiconductor substrate, an impurity region on the semiconductor substrate, the impurity region having a first conductivity, a drift region in the impurity region, the drift region having the first conductivity, a body region in the impurity region adjacent to the drift region, the body region having a second conductivity different from the first conductivity, a drain extension insulating layer on the drift region, a gate insulating layer and a gate electrode sequentially stacked across a portion of the body region and a portion of the drift region, a drain extension electrode on the drain extension insulating layer, a drain region contacting a side of the drift region opposite to the body region, the drain region having the first conductivity, and a source region in the body region, the source region having the second conductivity.

At least one recess region may be in a portion of an upper surface of the drift region. The drain extension insulating layer may be a shallow trench insulator (STI) that fills the at least one recess region.

The semiconductor device may further include a wiring line on the semiconductor substrate. The drain extension electrode may be a contact plug electrically connected to the wiring line.

The semiconductor device may further include a source contact plug electrically connecting the wiring line and the source region such that a common bias is provided to the drain extension electrode and the source region.

The semiconductor device may further include a body contact region in the body region and having the second conductivity, and a body contact plug electrically connecting the wiring line and the body contact region such that a common bias is provided to the drain extension electrode and the body contact region.

The body region, the drift region, and the drain region may be arranged along a first direction. The drain extension insulating layer extends along the first direction and has a bar-shaped horizontal cross-section with respect to the semiconductor substrate.

The drain extension insulating layer may include a plurality of drain extension insulating layers spaced apart from each other.

The plurality of drain extension insulating layers may be arranged along a second direction different from the first direction.

The gate electrode and the drain extension electrode may be integrally formed to be electrically connected to each other.

The drain extension electrode may extend from the gate electrode onto each of the plurality of drain extension insulating layers along the first direction in a finger shape.

A first portion of an end portion of the drain extension electrode in the first direction may be formed of undoped polysilicon, and a second portion of the end portion of the drain extension electrode is formed of doped polysilicon. In another implementation, the first portion of the end portion of the drain extension electrode and the second portion of the end portion of the drain extension electrode may be formed of doped polysilicon having different conductivities.

The semiconductor device may further include a barrier region in the semiconductor substrate under the impurity region, the barrier region having a carrier density higher than that of the impurity region.

The drift region may have a carrier density higher than that of the impurity region.

Embodiments are also directed to a semiconductor device including a power metal-oxide-semiconductor (MOS) transistor. The MOS transistor includes a semiconductor substrate, an impurity region on the semiconductor substrate, the impurity region having a first conductivity, a drift region in the impurity region, the drift region having the first conductivity, a body region in the impurity region adjacent to the drift region, the body region having a second conductivity different from the first conductivity, a plurality of recess regions in an upper surface of the drift region, extending from the body region along a first direction toward a drain region, and arranged to be spaced apart from each other along a second direction different from the first direction, a source region in the body region, the source region having the second conductivity, a drain region contacting a side of the drift region opposite to the body region, the drain region having the first conductivity, a plurality of drain extension insulating layers filling the plurality of recess regions, a gate insulating layer and a gate electrode sequentially stacked on the semiconductor substrate across a portion of the body region and a portion of the drift region, and a drain extension electrode on each of the plurality of drain extension insulating layers. Current flow paths are formed through portions of the drift region between the plurality of drain extension insulating layers and under the plurality of drain extension insulating layers.

The gate electrode and the drain extension insulating layer may be spaced apart from each other along the first direction.

Embodiments are also directed to a semiconductor device including a semiconductor substrate, an impurity region on the semiconductor substrate, the impurity region having a first conductivity, a drift region in the impurity region, the drift region having the first conductivity, a body region in the impurity region adjacent to the drift region, the body region having a second conductivity different from the first conductivity, a source region in the body region, the source region having the second conductivity, a drain region contacting a side of the drift region opposite to the body region, the drain region having the first conductivity, the drift region including a recess in an upper surface of the drift region, and the recess extending in a first direction from the drain region toward the body region, a drain extension insulating layer filling the recess of the drift region, a gate insulating layer and a gate electrode sequentially stacked across a portion of the body region and a portion of the drift region, and a drain extension electrode on an upper surface of the drain extension insulating layer.

The drain extension electrode on the upper surface of the drain extension insulating layer may be spaced apart from boundary portions between the drain extension insulating layer and the drift region on at least three sides of the drain extension electrode The drain extension electrode may extend from the gate electrode onto the drain extension insulating layer in a finger shape in the first direction.

The drain extension electrode may include rounded portions where the drain extension electrode and the gate electrode are connected.

An end portion of the drain extension electrode may extend in the first direction with a narrower width than a remaining portion of the drain extension electrode

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It also is to be understood that, although the terms "first", "second", etc. may be used herein to describe various elements, these elements should not be limited by these terms. These terms are only used to distinguish one element from another element. Thus, a first element discussed below could be termed a second element without departing from the teachings of exemplary embodiments, or vice versa.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless defined differently, all terms used in the description have the same meaning as generally understood by one of ordinary skill in the art.

As used herein, the term "and/or" includes any and all combinations of at least one of the associated listed items. Expressions such as "at least one of," when preceding a list of elements, modify the entire list of elements and do not modify the individual elements of the list.

Figure 1:
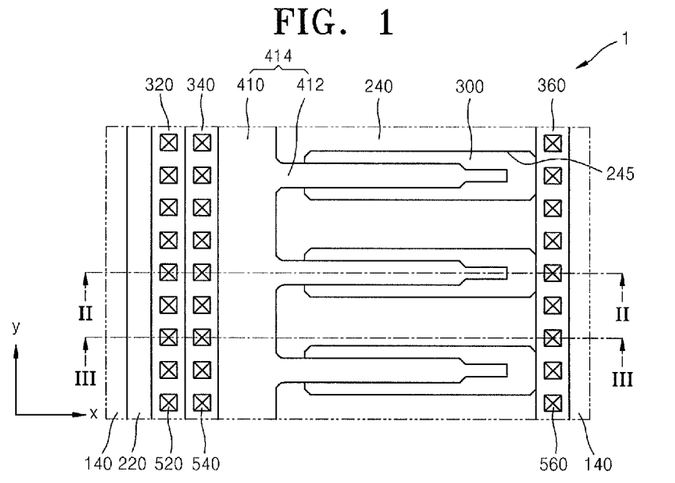
FIGS. 1 through 3 illustrate plan and cross-sectional views of a semiconductor device having a power metal-oxide-semiconductor (MOS) transistor, according to an embodiment.
Figure 2:
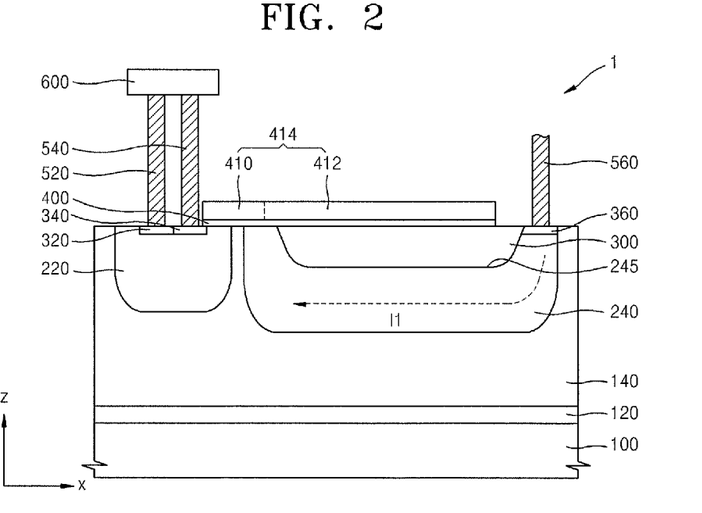
Figure 3:
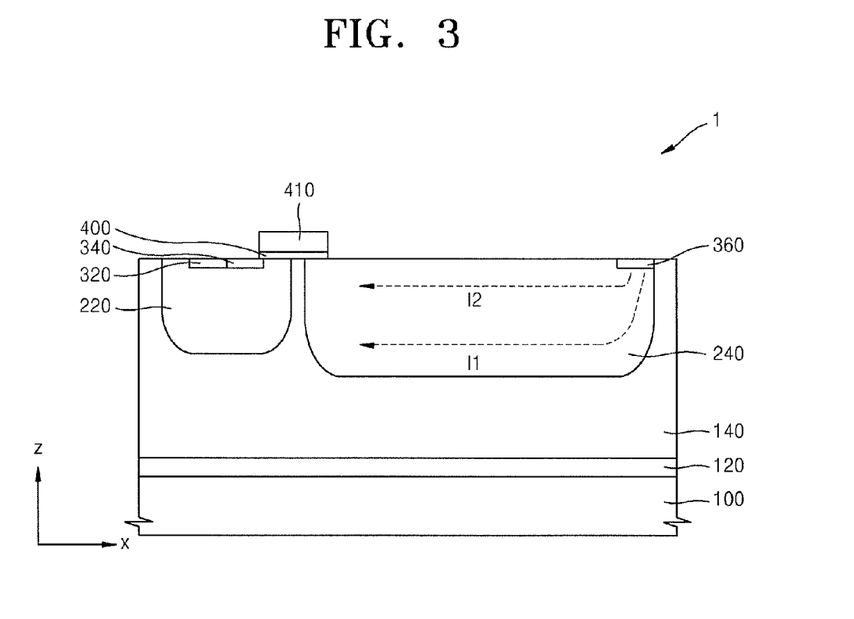

FIGS. 1 through 3 illustrate plan and cross-sectional views of a semiconductor device 1 having a power metal-oxide-semiconductor (MOS) transistor, according to an embodiment. In more detail, FIGS. 2 and 3 are cross-sectional views cut along lines II-II and of FIG. 1, respectively. For convenience of illustration, a wiring line 600 depicted in FIG. 2 is not illustrated in FIG. 1.

Referring to FIGS. 1 through 3, in the semiconductor device 1, an impurity region 140 having a first conductivity may be formed on a semiconductor substrate 100, and a body region 220 having a second conductivity different from the first conductivity, and a drift region 240 having the first conductivity may be formed in the impurity region 140. Although the body region 220 and the drift region 240 are spaced apart from each other by the impurity region 140 in FIGS. 2 and 3, in other implementations, the body region 220 and the drift region 240 may directly contact each other.

A barrier region 120 may be further formed between the semiconductor substrate 100 and the impurity region 140, or in a portion of an upper surface of the semiconductor substrate 100 contacting the impurity region 140. The barrier region 120 may have a carrier density higher than that of the semiconductor substrate 100 and/or that of the impurity region 140. The barrier region 120 may have the second conductivity or the first conductivity.

A source region 340 having the second conductivity may be formed in the body region 220, and more particularly, in a portion of an upper surface of the body region 220. Also, a body contact region 320 having the first conductivity may be formed in the body region 220, and more particularly, in another portion of the upper surface of the body region 220. The body contact region 320 and the source region 340 may be formed to contact or to be spaced apart from each other.

A drain region 360 having the second conductivity may be formed to contact a side of the drift region 240 opposite to the body region 220. The drain region 360 may be formed in the drift region 240, may be formed to contact the drift region 240, or may be formed across the drift region 240 and the impurity region 140. The drain region 360 may be formed in a portion of an upper surface of the drift region 240 and/or a portion of an upper surface of the impurity region 140.

A drain extension insulating layer 300 may be formed on the drift region 240. The drain extension insulating layer 300 may be a shallow trench insulator (STI) formed to fill at least one recess region 245 formed in a portion of the upper surface of the drift region 240. Corners of the drain extension insulating layer 300 may be rounded. An area of a horizontal cross-section of the drain extension insulating layer 300 may gradually decrease as its depth increases.

A gate electrode 410 may be formed on the semiconductor substrate 100 across a portion of the body region 220 and a portion of the drift region 240. The gate electrode 410 may be formed to extend from being on the body region 220 to being on the drift region 240. A drain extension electrode 412 may extend from the gate electrode 410 onto the drain extension insulating layer 300. The gate electrode 410 and the drain extension electrode 412 may integrally form an extended gate electrode 414. The gate electrode 410 and the drain extension electrode 412 may be formed together by forming a conductive material to cover the semiconductor substrate 100 and then patterning the conductive material. The gate electrode 410 may be a portion of the extended gate electrode 414 which extends along a second direction (y direction). The drain extension electrode 412 may be a finger-shaped portion of the extended gate electrode 414 which extends from the gate electrode 410 along a first direction (x direction). The drain extension electrode 412 may be formed across a portion of the drift region 240 and a portion of the drain extension insulating layer 300. The gate electrode 410 may be formed selectively on a portion of the source region 340. The first direction (x direction) and the second direction (y direction) may be different directions, for example, perpendicular directions.

The extended gate electrode 414 may include rounding portions where the gate electrode 410 and the drain extension electrode 412 are connected, thereby dispersing an electric field. An extending direction width of the extended gate electrode 414 may be reduced at one end of the drain extension electrode 412 away from the gate electrode 410, thereby also dispersing an electric field. As described above, in order to prevent concentration of an electric field, the shape of the extended gate electrode 414 may be optimized by adjusting its extending direction width or by rounding its corners.

Portions where the extending direction width of the extended gate electrode 414 is reduced may have the same length, as shown in FIG. 1. In other implementations, if a plurality of drain extension electrodes 412 extend from the gate electrode 410 in one power MOS transistor, all or some of the portions where the extending direction width of the extended gate electrode 414 is reduced may have different lengths.

A gate insulating layer 400 may be formed under the gate electrode 410. The gate insulating layer 400 and the gate electrode 410 may be sequentially stacked on the semiconductor substrate 100. The gate insulating layer 400 may also be formed under the drain extension electrode 412. The gate insulating layer 400 and the extended gate electrode 414 may be formed by forming and then patterning a preliminary gate insulating layer and a conductive material on the semiconductor substrate 100. The gate insulating layer 400 may also be formed on the drain extension insulating layer 300 as shown in FIG. 2. In other implementations, forming the gate insulation layer 400 on the drain extension layer may be omitted. For example, if the gate insulating layer 400 is formed by using a vapor deposition method, the gate insulating layer 400 may also be formed on the drain extension insulating layer 300. However, if the gate insulating layer 400 is formed by using a thermal oxidation method, forming the gate insulating layer 400 on the drain extension insulating layer 300 may be omitted. Also, when the gate insulating layer 400 is formed on the drain extension insulating layer 300, if the same or similar materials are used, the gate insulating layer 400 and the drain extension insulating layer 300 may be viewed as being not separated but integrated.

The drain extension insulating layer 300 may extend along the first direction (x direction), and may have a bar-shaped horizontal cross-section with respect to the semiconductor substrate 100. A plurality of drain extension insulating layers 300 may be spaced apart from each other. If a plurality of drain extension insulating layers 300 is formed, the drain extension insulating layers 300 may be arranged along the second direction (y direction).

The drain extension electrode 412 may extend from the gate electrode 410 onto the drain extension insulating layer 300 to cross one side of the drain extension insulating layer 300 having a bar shape. The drain extension electrode 412 may be formed to cross only one side of the drain extension insulating layer 300 having a bar shape, adjacent to the body region 220, and not to cross, and to be spaced apart from, the other three sides of the drain extension insulating layer 300. Accordingly the gate electrode 410 may be formed to be spaced apart from boundaries between the drain extension insulating layer and the drift region on the drain extension insulating layer 300. The gate electrode 410 may not be formed on and thus may be spaced apart from portions of the drift region 240 between the drain extension insulating layers 300.

The source region 340, the body region 220, the drain region 360, and the gate electrode 410 may form the power MOS transistor. Also, the source region 340, the body region 220, the drain region 360, and the gate electrode 410 may form the power MOS transistor together with the drift region 240 and the drain extension electrode 412 and, in this case, the drift region 240 may function to extend the drain region 360.

A body contact plug 520, a source contact plug 540, and a drain contact plug 560 may be respectively formed on the body contact region 320, the source region 340, and the drain region 360. The body contact plug 520, the source contact plug 540, and the drain contact plug 560 may be formed by forming an interlayer insulating layer on the semiconductor substrate 100 on which the body contact region 320, the source region 340, and the drain region 360 are formed, forming contact holes to expose portions of the body contact region 320, the source region 340, and the drain region 360, and filling the contact holes with a conductive material. The body contact plug 520, the source contact plug 540, and the drain contact plug 560 may have the same height. In other implementations, all or some of the body contact plug 520, the source contact plug 540, and the drain contact plug 560 may have different heights. If all or some of the body contact plug 520, the source contact plug 540, and the drain contact plug 560 have different heights, a plurality of interlayer insulating layers may be formed and the contact holes may be formed to penetrate all or some of the interlayer insulating layers.

A wiring line 600 may be formed on the body contact plug 520 and the source contact plug 540. The wiring line 600 may be electrically connected to the body contact plug 520 and the source contact plug 540 and may apply a common bias to the body contact region 320 electrically connected to the body contact plug 520, and the source region 340 electrically connected to the source contact plug 540. In other implementations, the body contact plug 520 and the source contact plug 540 may be electrically connected to different wiring lines 600 and different biases may be applied to the body contact region 320 and the source region 340.

The first conductivity may be an n-type or a p-type and the second conductivity may be a p-type or an n-type. If the first conductivity is an n-type and the second conductivity is a p-type, the power MOS transistor formed in the semiconductor device 1 may be an n-type power MOS transistor. If the first conductivity is a p-type and the second conductivity is an n-type, the power MOS transistor formed in the semiconductor device 1 may be a p-type power MOS transistor.

The gate electrode 410 and the drain extension electrode 412 may be formed of undoped polysilicon or doped polysilicon. If the gate electrode 410 and the drain extension electrode 412 are formed of doped polysilicon, they may be doped with an n-type (n+ or n−) or p-type (p+ or p−) impurity.

As examples, if the power MOS transistor formed in the semiconductor device 1 is an n-type power MOS transistor, the semiconductor substrate 100 may be a p-type and may have a carrier density of about $1015/cm^3$, and the barrier region 120 may be a p-type or an n-type and may have a carrier density equal to or greater than about $1019/cm^3$. The impurity region 140 may be an n-type and may have a carrier density of about $1015/cm^3$ and the drift region 240 may be an n-type and may have a carrier density equal to or less than about $1016/cm^3$ and the body region 220 may be a p-type and may have a carrier density of about $1017/cm^3$ to about $1018/cm^3$ The body contact region 320, the source region 340, and the drain region 360 may respectively be a p-type, an n-type, and an n-type and may have a carrier density equal to or greater than about $1019/cm^3$ If a negative bias is applied to the gate electrode 410 and the drain extension electrode 412, depletion occurs in the drift region 240, and thus, an effect of extending the drain region 360 may be obtained. Accordingly, in the power MOS transistor formed in the semiconductor device 1, a first current flow path I1 may be formed through lower portions of the drift region 240 under the drift diffusion insulating layers 300, and a second current flow path I2 may be formed through upper portions of the drift region 240 between the drift diffusion insulating layers 300. If only the first current flow path I1 is considered, the power MOS transistor formed in the semiconductor device 1 may operate like a laterally diffused metal-oxide-semiconductor (LDMOS). If only the second current flow path I2 is considered, the power MOS transistor formed in the semiconductor device 1 may operate like a drain-extended metal-oxide-semiconductor (DEMOS). The power MOS transistor formed in the semiconductor device 1 may be a hybrid of an LDMOS and a DEMOS. Accordingly, the power MOS transistor may have advantages of both an LDMOS and the DEMOS. That is, in the power MOS transistor formed in the semiconductor device 1, current flow paths may be increased and an operation resistance $R_{DSon}$ between the drain region 360 and the source region 340 may be reduced. Accordingly, even when a high voltage is used, heat may be minimized. Also, an electric field formed between the drain region 360 and the source region 340 may be dispersed to portions of the drift region 240 between and under the drift diffusion insulating layers 300. Accordingly a high breakdown voltage may be achieved, and thus, the reliability of the semiconductor device 1 may be improved.

As examples, if the power MOS transistor formed in the semiconductor device 1 is a p-type power MOS transistor, conductivities of elements may be selected to be opposite to those in an n-type power MOS transistor.

Also, the gate electrode 410 may be formed to be spaced apart from the drift region 240 on the drain extension insulating layer 300. Accordingly, the concentration of an electric field due to the gate electrode 410 on portions of the drift region 240 between the drain extension insulating layers 300 may be reduced or prevented, and a breakdown voltage may be highly maintained.

Accordingly, a chip size may be reduced by forming the semiconductor device 1 to include the power MOS transistor integrally with an integrated circuit for controlling power, and power efficiency may be increased by minimizing power loss in a chip.

Figure 4:
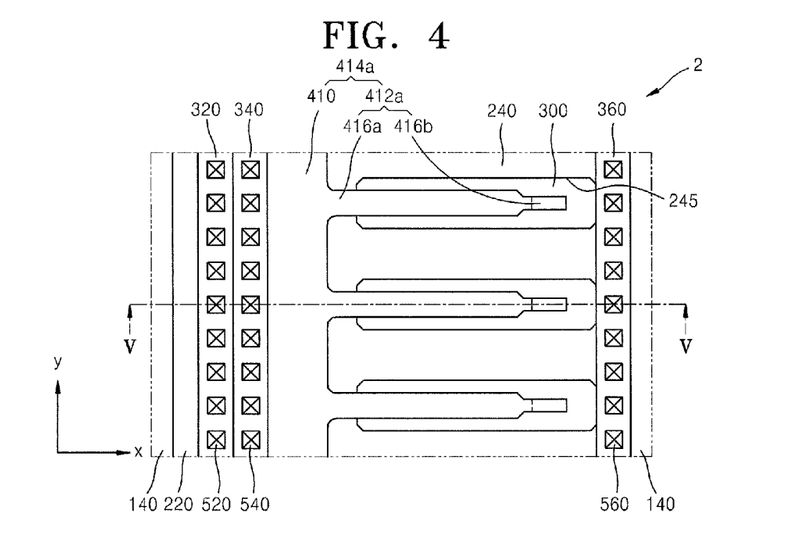
FIGS. 4 and 5 illustrate plan and cross-sectional views of a semiconductor device having a power MOS transistor, according to another embodiment.
Figure 5:
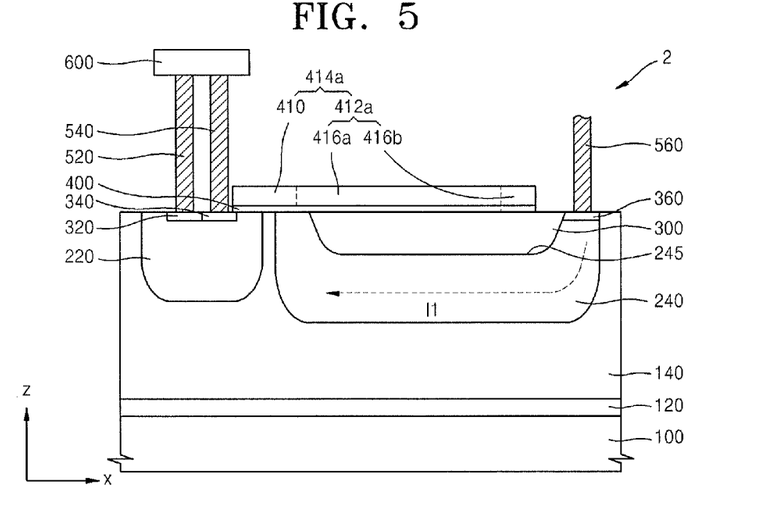

FIGS. 4 and 5 illustrate plan and cross-sectional views of a semiconductor device 2 having a power MOS transistor, according to another embodiment. In more detail, FIG. 5 is a cross-sectional view cut along a line V-V of FIG. 4. For convenience of illustration, the wiring line 600 depicted in FIG. 5 is not illustrated in FIG. 4. In FIGS. 4 and 5, elements other than a drain extension electrode 412a are the same as those illustrated in FIGS. 1 through 3 and thus detailed descriptions thereof are not repeated.

Referring to FIGS. 4 and 5, the semiconductor device 2 includes an extended gate electrode 414a including the gate electrode 410 and the drain extension electrode 412a. The drain extension electrode 412a may include a first drain extension electrode 416a and a second drain extension electrode 416b. The second drain extension electrode 416b may be an end portion of the drain extension electrode 412a in the first direction (x direction), i.e., an end portion of the drain extension electrode 412a extending from the gate electrode 410, and the first drain extension electrode 416a may be a portion of the drain extension electrode 412a other than the second drain extension electrode 416b.

In the extended gate electrode 414a, the second drain extension electrode 416b may have conductivity different from that of the other portions of the extended gate electrode 414a, i.e., the gate electrode 410 and the first drain extension electrode 416a, or may not have conductivity. For example, if the gate electrode 410 and the first drain extension electrode 416a are formed of n-type (n+ or n−) doped polysilicon, the second drain extension electrode 416b may be formed of p-type (p+ or p−) doped polysilicon or undoped polysilicon. Likewise, if the gate electrode 410 and the first drain extension electrode 416a are formed of p-type (p+ or p−) doped polysilicon, the second drain extension electrode 416b may be formed of n-type (n+ or n−) doped polysilicon or undoped polysilicon.

For example, when the whole extended gate electrode 414a is formed of n-type doped polysilicon, if a negative bias is applied to cause depletion in the drift region 240 that is an n-type, electrons may accumulate in a portion of the extended gate electrode 414a. However, if the second drain extension electrode 416b is formed of p-type doped polysilicon or undoped polysilicon, accumulation of electrons may be hindered or prevented. Accordingly, the concentration of an electric field at an end of the extended gate electrode 414a, i.e., the second extension drain extension electrode 416b, may be hindered or prevented, and thus, a breakdown voltage may be highly maintained.

Figure 6:
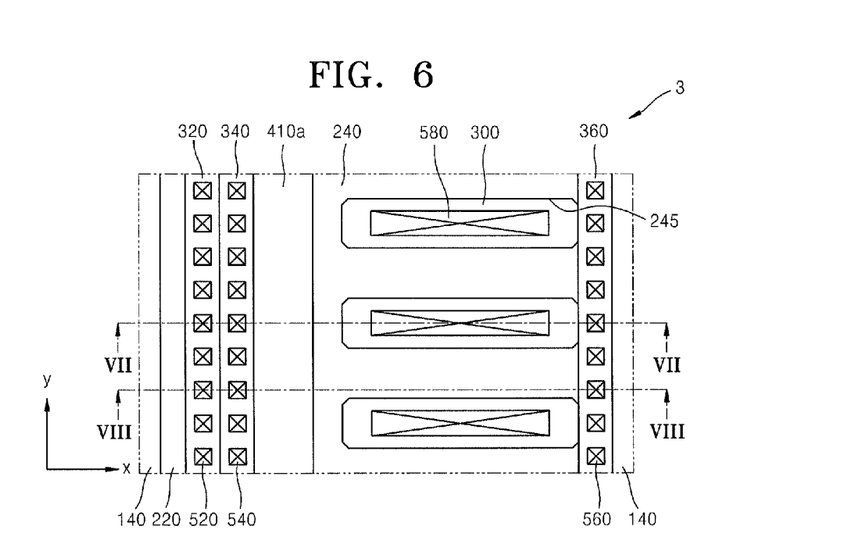
FIGS. 6 through 8 illustrate plan and cross-sectional views of a semiconductor device having a power MOS transistor, according to another embodiment.
Figure 7:
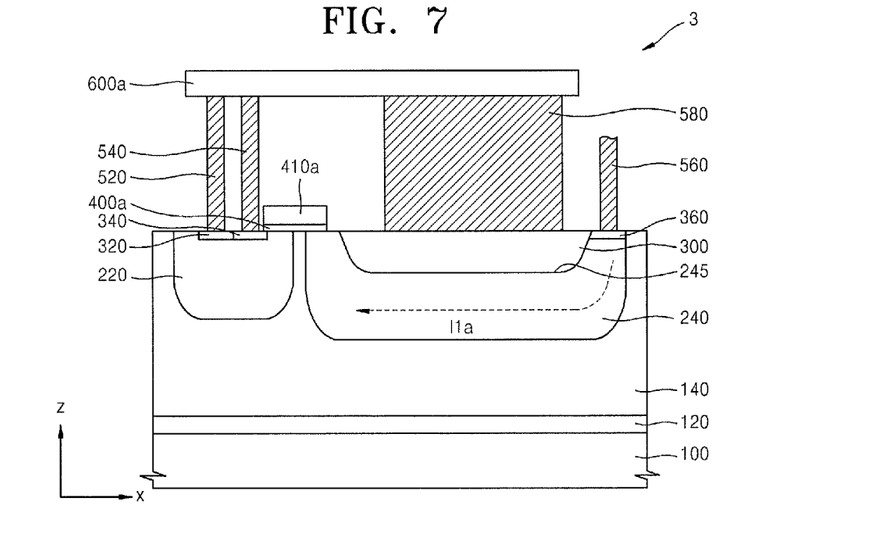
Figure 8:
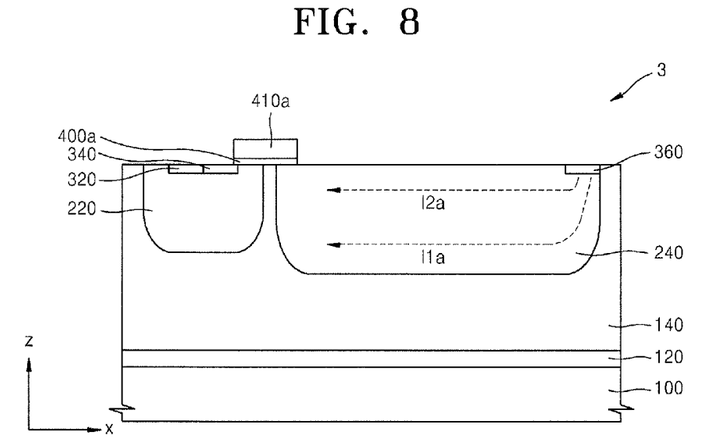

FIGS. 6 through 8 illustrate plan and cross-sectional views of a semiconductor device 3 having a power MOS transistor, according to another embodiment. In more detail, FIGS. 7 and 8 are cross-sectional views cut along lines VII-VII and VIII-VIII of FIG. 6. For convenience of illustration, a wiring line 600a depicted in FIG. 7 is not illustrated in FIG. 6. In FIG. 6 through 8, elements other than a gate electrode 410a and a drain extension electrode 580 are almost the same as those illustrated in FIGS. 1 through 3 and thus detailed descriptions thereof will not be repeated.

Referring to FIGS. 6 through 8, the semiconductor device 3 includes the gate electrode 410a and the drain extension electrode 580. Unlike the semiconductor device 1 illustrated in FIGS. 1 through 3, in the semiconductor device 3 illustrated in FIGS. 6 through 8, the gate electrode 410a and the drain extension electrode 580 are not integrally formed. The drain extension electrode 580 may be formed as a contact plug, like the body contact plug 520 and/or the source contact plug 540. Like the body contact plug 520 and/or the source contact plug 540, the drain extension electrode 580 may be formed by forming a slot-shaped contact hole in an interlayer insulating layer to expose a portion of the drain extension insulating layer 300, and filling the contact hole with a conductive material. The drain extension electrode 580 may extend along the first direction (x direction), and may have a bar-shaped horizontal cross-section with respect to the semiconductor substrate 100. The drain extension electrode 580 may be formed together with the body contact plug 520 and/or the source contact plug 540.

The drain extension electrode 580 may be electrically connected to the wiring line 600a so as to receive a common bias together with the body contact region 320 and/or the source region 340. The drain extension electrode 580 may be electrically connected to the body contact region 320 via the wiring line 600a and the body contact plug 520, and thus may receive a common bias together with the body contact region 320 via the wiring line 600a. In other implementations, the drain extension electrode 580 may be electrically connected to the source contact region 340 via the wiring line 600a and the source contact plug 540, and thus may receive a common bias together with the source contact region 340 via the wiring line 600a. In other implementations, the drain extension electrode 580 may be electrically connected to the body contact region 320 and the source region 340 via the wiring line 600a, the body contact plug 520, and the source contact plug 540, and thus may receive a common bias together with the body contact region 320 and the source region 340 via the wiring line 600a.

In the semiconductor device 1 illustrated in FIGS. 1 through 3, a common bias may be provided to the gate electrode 410 and the drain extension electrode 412 so as to cause depletion in the drift region 240. However, in the semiconductor device 3 illustrated in FIGS. 6 through 8, a common bias may be provided to the body contact region 320 and/or the source region 340, and the drain extension electrode 580 so as to cause depletion in the drift region 240.

Accordingly, although the semiconductor device 1 illustrated in FIGS. 1 through 3 and the semiconductor device 3 illustrated in FIGS. 6 through 8 may use different methods of providing a bias to the drain extension electrodes 412 and 580, they may use the same principle and method of operating the power MOS transistor.

FIGS. 9 through 20 illustrate plan and cross-sectional views for describing stages of a method of manufacturing a semiconductor device having a power MOS transistor, according to an embodiment. A semiconductor device having an n-type power MOS transistor is representatively described below. A semiconductor device having a p-type power MOS transistor may be manufactured by selecting opposite conductivities.

Figure 9:
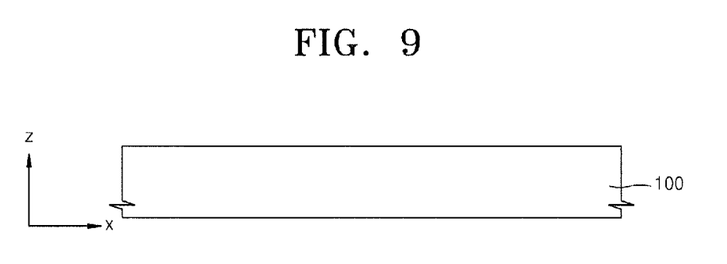
FIG. 9 illustrates a cross-sectional view for describing an operation of preparing a semiconductor substrate, according to an embodiment.

FIG. 9 illustrates a cross-sectional view for describing an operation of preparing a semiconductor substrate 100, according to an embodiment.

Referring to FIG. 9, the semiconductor substrate 100 is prepared. The semiconductor substrate 100 may be formed as, for example, a substrate including a semiconductor material, e.g., a silicon substrate, a silicon-on-insulator (SOI) substrate, a gallium-arsenic substrate, or a silicon germanium substrate, a ceramic substrate, a quartz substrate, or a glass substrate for a display. An impurity injection region such as a well may be formed in the semiconductor substrate 100. If the semiconductor substrate 100 is a p-type, the semiconductor substrate 100 may be a bare wafer including a p-type impurity, or a well that is formed in a substrate including a semiconductor material, and into which a p-type impurity is injected. In other implementations, the semiconductor substrate 100 may have a structure in which a semiconductor layer having a relatively low carrier density is formed on a wafer having a relatively high carrier density (p+/p− or n+/n−).

Figure 10:
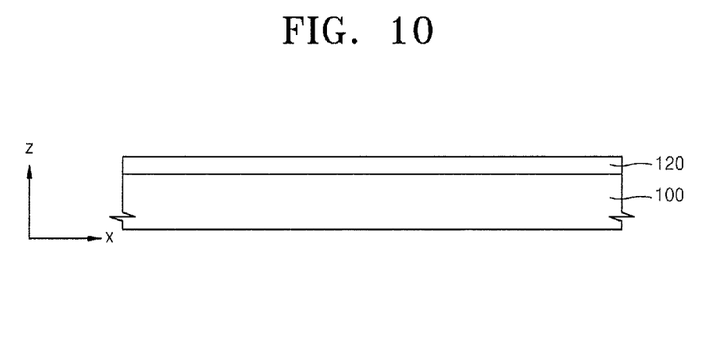
FIG. 10 illustrates a cross-sectional view for describing an operation of forming a barrier region, according to an embodiment.

FIG. 10 illustrates a cross-sectional view for describing an operation of forming a barrier region 120, according to an embodiment.

Referring to FIG. 10, the barrier region 120 may be formed on the semiconductor substrate 100 or on a portion of an upper surface of the semiconductor substrate 100. The barrier region 120 may be an insulating material formed on the semiconductor substrate 100, or a partial region of the upper surface of the semiconductor substrate 100, into which a high-density impurity is injected. In more detail, the barrier region 120 may be an oxide layer vapor-deposited or thermally grown on the semiconductor substrate 100, or a high-density impurity region into which an impurity is ion-injected through the upper surface of the semiconductor substrate 100. The barrier region 120 may be a semiconductor material layer doped with n+ or a semiconductor material layer doped with p+. The barrier region 120 may have, for example, a carrier density equal to or greater than about $10^{19}/cm^3$.

Figure 11:
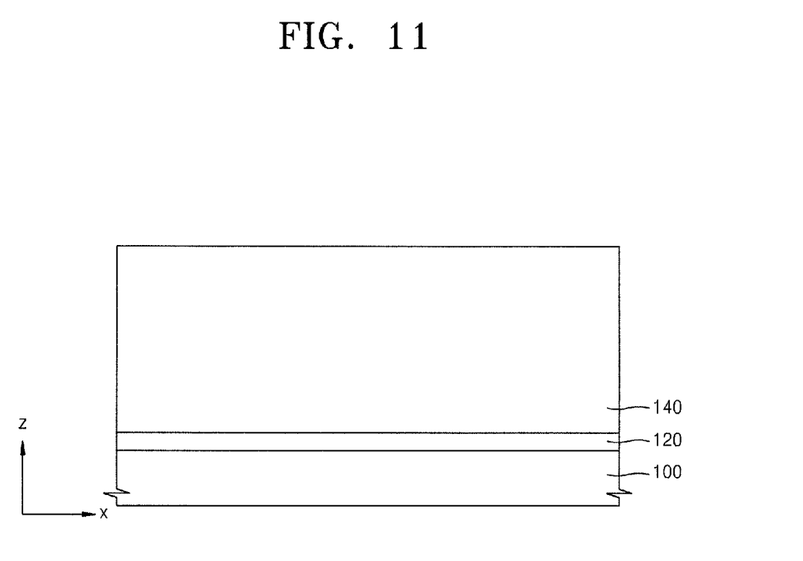
FIG. 11 illustrates a cross-sectional view for describing an operation of forming an impurity region, according to an embodiment.

FIG. 11 illustrates a cross-sectional view for describing an operation of forming an impurity region 140, according to an embodiment.

Referring to FIG. 11, the impurity region 140 is formed on the semiconductor substrate 100. If the barrier region 120 is formed, the impurity region 140 may be formed on the barrier region 120. The impurity region 140 may be formed by using an epitaxial growing method, and may be an n-doped semiconductor material layer. The impurity region 140 may have a carrier density of about $10^{15}/cm^3$ to about $10^{16}/cm^3$ In other implementation of the method of forming the barrier region 120 and the impurity region 140, the barrier region 120 may be formed by ion-injecting a relatively high-density impurity into a deep portion from a surface of the semiconductor substrate 100, and the impurity region 140 may be formed by ion-injecting a relatively low-density impurity into a shallow portion from the surface of the semiconductor substrate 100.

Figure 12:
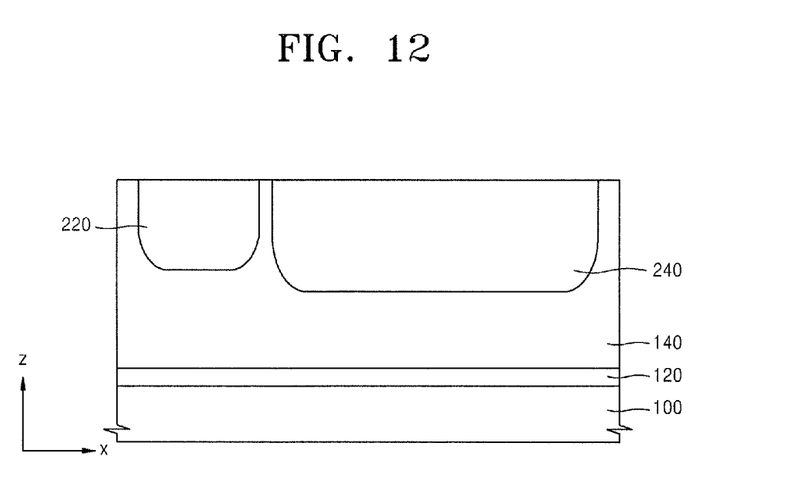
FIG. 12 illustrates a cross-sectional view for describing an operation of forming a body region and a drift region, according to an embodiment.

FIG. 12 illustrates a cross-sectional view for describing an operation of forming a body region 220 and a drift region 240, according to an embodiment.

Referring to FIG. 12, the body region 220 and the drift region 240 may be respectively formed by injecting a p-type impurity and an n-type impurity into portions of the impurity region 140, i.e., portions of an upper surface of the impurity region 140.

The body region 220 may have a carrier density of about $10^{17}/cm^3$ to about $10^{18}/cm^3$ The drift region 240 may have a carrier density equal to or less than about $10^{16}/cm^3$ The body region 220 and the drift region 240 may have carrier densities higher than that of the impurity region 140. The drift region 240 may be formed to have a relatively low carrier density if a relatively high voltage is used in a semiconductor device to be formed, or to have a relatively high carrier density if a relatively low voltage is used in the semiconductor device, but to have a carrier density higher than that of the impurity region 140.

The body region 220 and the drift region 240 as shown as being spaced apart from each other by the impurity region 140 in FIG. 12. In other implementations, the body region 220 and the drift region 240 may be formed to directly contact each other.

Figure 13:
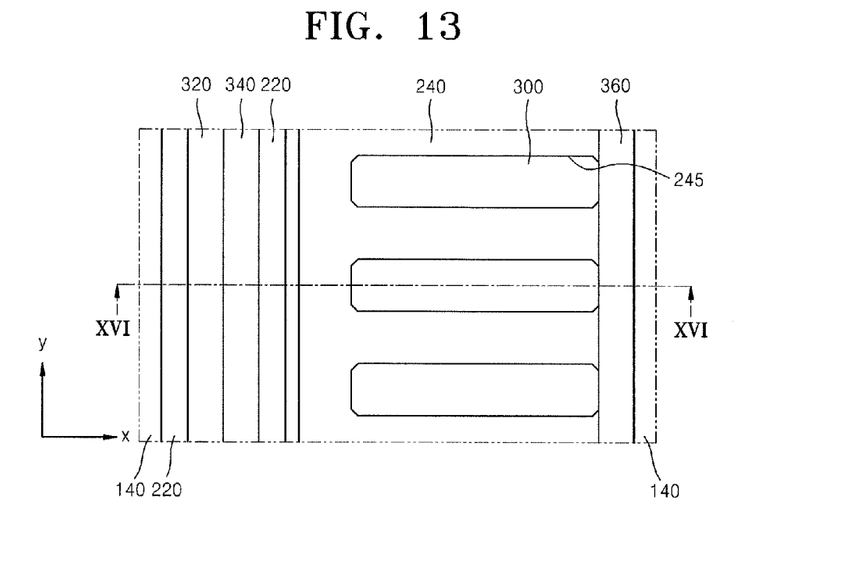
FIGS. 13 and 14 illustrate plan and cross-sectional views for describing an operation of forming a body contact region, a source region, a drain region, and a drain extension insulating layer, according to an embodiment.
Figure 14:
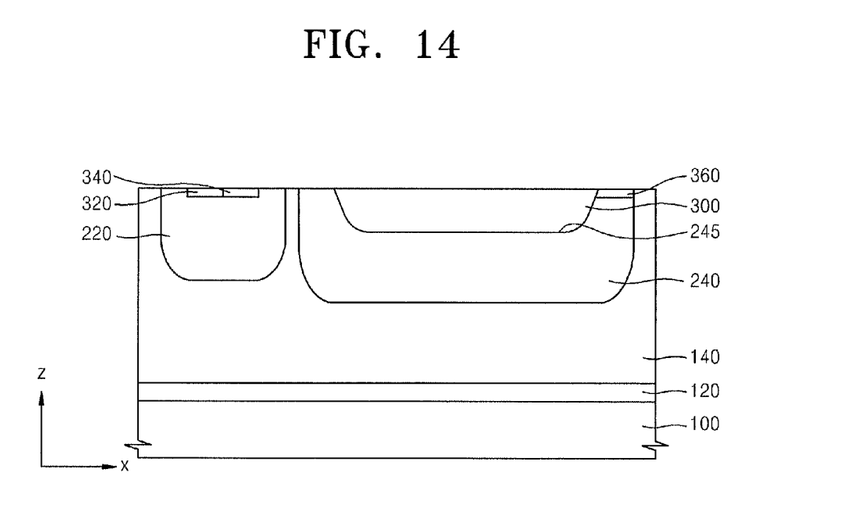

FIGS. 13 and 14 illustrate plan and cross-sectional views for describing an operation of forming a body contact region 320, a source region 340, a drain region 360, and a drain extension insulating layer 300, according to an embodiment. In more detail, FIG. 14 is a cross-sectional view cut along a line XIV-XIV of FIG. 13.

Referring to FIGS. 13 and 14, the body contact region 320 and the source region 340 may be respectively formed by injecting a p-type impurity and an n-type impurity into portions of an upper surface of the body region 220. Also, the drain region 360 may be formed by injecting an n-type impurity into a portion of an upper surface of the drift region 240 and/or a portion of an upper surface of the impurity region 140. The source region 340 and the drain region 360 may be simultaneously formed by injecting an n-type impurity. The body contact region 320 and the source region 340 are shown in FIGS. 13 and 14 as directly contacting each other. In other implementations, the body contact region 320 and the source region 340 may be formed to be spaced apart from each other.

Before or after forming the body contact region 320 and/or the source and drain regions 340 and 360, at least one recess region 245 may be formed in the upper surface of the drift region 240 by removing a portion of the drift region 240. After that, the drain extension insulating layer 300 may be formed by filling the recess region 245 with an insulating material. An upper surface of the drain extension insulating layer 300 and the upper surface of the drift region 240 are shown in FIG. 14 as being located in the same plane. In other implementation, the upper surface of the drain extension insulating layer 300 may be located higher than the upper surface of the drift region 240.

The drain extension insulating layer 300 may be formed of an oxide, a nitride, an oxynitride, or a combination thereof.

Figure 15:
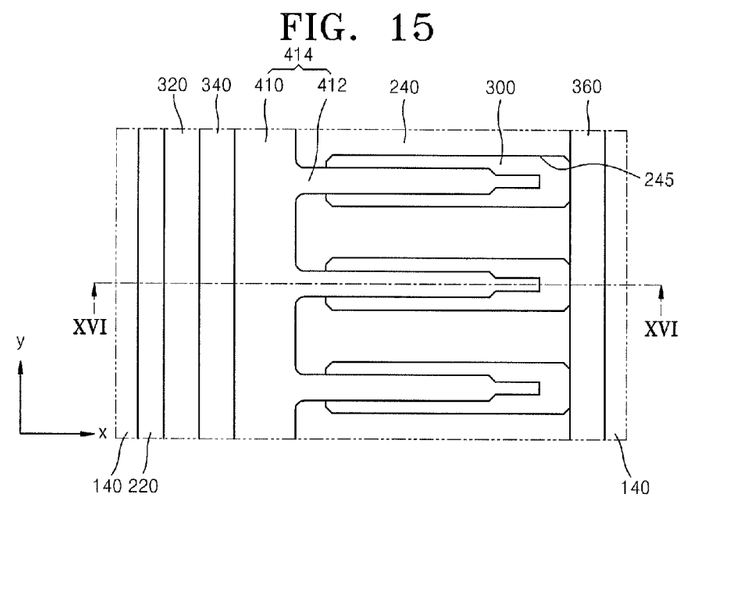
FIGS. 15 and 16 illustrate plan and cross-sectional views for describing an operation of forming a gate electrode and a drain extension electrode, according to an embodiment.
Figure 16:
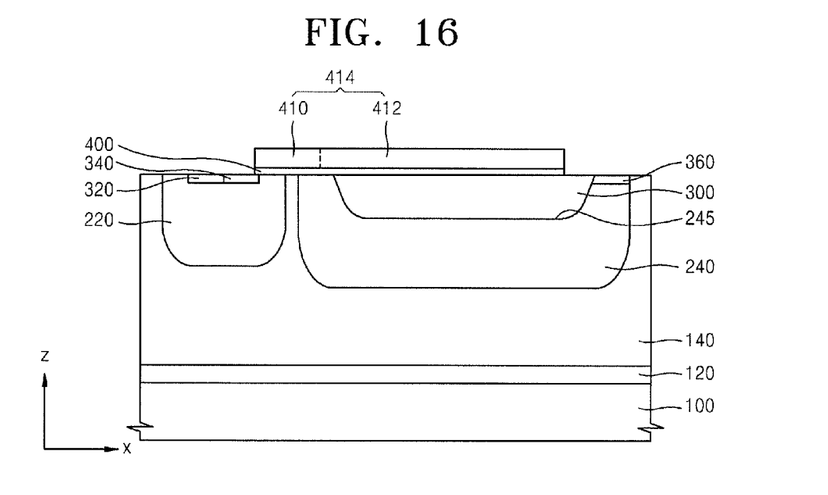

FIGS. 15 and 16 illustrate plan and cross-sectional views for describing an operation of forming a gate electrode 410 and a drain extension electrode 412, according to an embodiment. FIG. 16 is a cross-sectional view cut along a line XVI-XVI of FIG. 15.

Referring to FIGS. 15 and 16, an extended gate electrode 414, including the gate electrode 410 extending from being on the body region 220 to being the drift region 240, and the drain extension electrode 412 extending from the gate electrode 410 onto the drain extension insulating layer 300 is formed. A gate insulating layer 400 may be formed on the extended gate electrode 414. In more detail, the gate insulating layer 400 and the extended gate electrode 414 may be formed by forming and then patterning a preliminary gate insulating layer and a conductive material on the semiconductor substrate 100. The extended gate electrode 414 may be formed of undoped polysilicon or doped polysilicon. If the extended gate electrode 414 is formed of doped polysilicon, the extended gate electrode 414 may be doped with an n-type (n+ or n−) or p-type (p+ or p−) impurity.

As illustrated in FIGS. 1 through 3, a body contact plug 520, a source contact plug 540, and a drain contact plug 560 may be formed, and then a wiring line 600 may be formed, thereby forming a semiconductor device 1 having a power MOS transistor.

The body contact plug 520, the source contact plug 540, and the drain contact plug 560 may be formed by performing a series of processes of vapor-depositing an interlayer insulating layer, forming a contact hole, and filling the contact hole with a conductive material, at least once. At least one of the body contact plug 520, the source contact plug 540, and the drain contact plug 560 may have a structure in which two or more plug electrodes are stacked.

Figure 17:
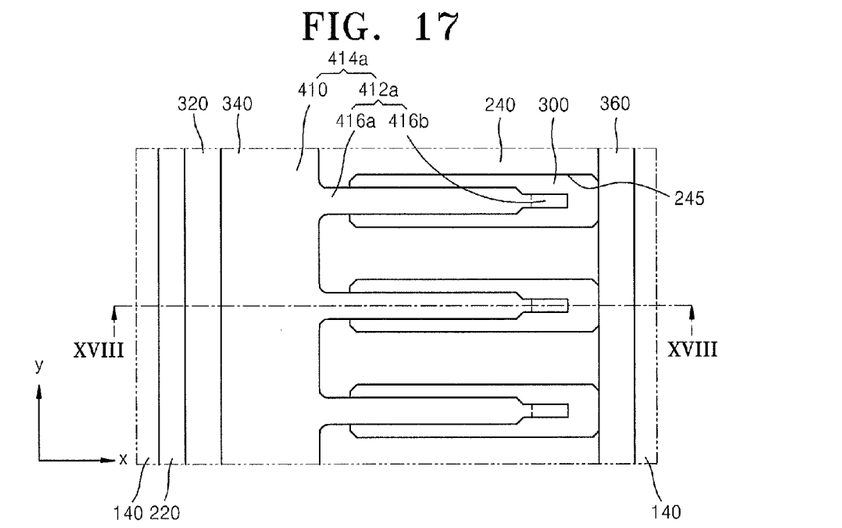
FIGS. 17 and 18 illustrate plan and cross-sectional views for describing an operation of forming a gate electrode and a drain extension electrode, according to another embodiment.
Figure 18:
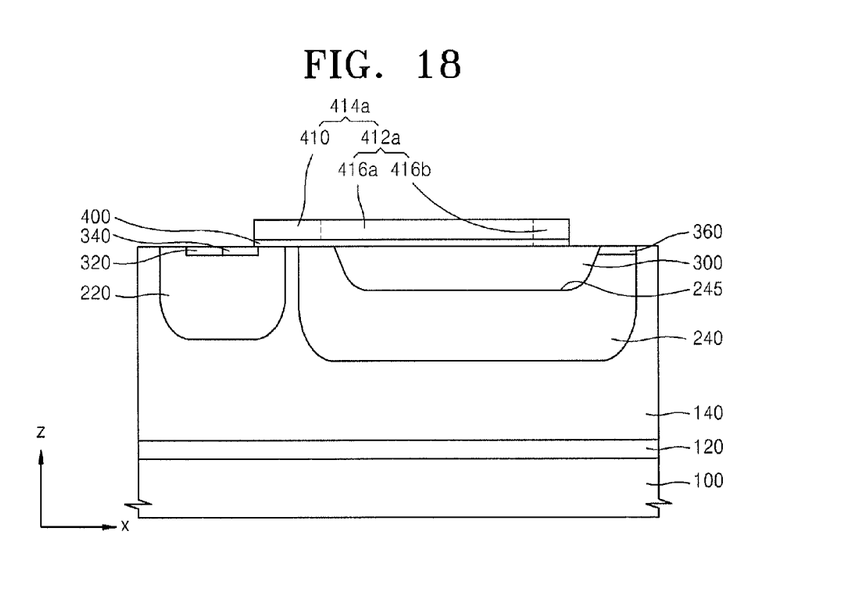

FIGS. 17 and 18 illustrate plan and cross-sectional views for describing an operation of forming a gate electrode 410 and a drain extension electrode 412a, according to another embodiment. In more detail, FIG. 18 is a cross-sectional view cut along a line XVIII-XVIII of FIG. 17.

Referring to FIGS. 15 through 18, an extended gate electrode 414a illustrated in FIGS. 17 and 18 may be formed by forming the extended gate electrode 414 illustrated in FIGS. 15 and 16 by using undoped polysilicon and then injecting an impurity into a portion of the drain extension electrode 412, or by forming the extended gate electrode 414 illustrated in FIGS. 15 and 16 by using doped polysilicon and then injecting into a portion of the drain extension electrode 412 an impurity having conductivity different from that of the doped polysilicon.

A portion of the extended gate electrode 414a that extends along a second direction (y direction) may be referred to as the gate electrode 410, and a finger-shaped portion of the extended gate electrode 414a which extends from the gate electrode 410 along a first direction (x direction) may be referred to as the drain extension electrode 412a. Also, a portion of the drain extension electrode 412a that contacts the gate electrode 410 and has the same conductivity as that of the gate electrode 410 may be referred to as a first drain extension electrode 416a, and an end portion of the drain extension electrode 412a opposite to the gate electrode 410, which has conductivity different from that of the first drain extension electrode 416a or does not have conductivity, may be referred to as the second drain extension electrode 416b.

If the second drain extension electrode 416b is formed of undoped polysilicon, the extended gate electrode 414a may be formed by forming the whole extended gate electrode 414 illustrated in FIGS. 15 and 16 by using undoped polysilicon, and then injecting an impurity into a portion other than the second drain extension electrode 416b.

If the second drain extension electrode 416b is formed of polysilicon having conductivity different from that of the other portions of the extended gate electrode 414a, the extended gate electrode 414a may be formed by forming the whole extended gate electrode 414 illustrated in FIGS. 15 and 16 by using doped polysilicon, and then injecting an impurity having conductivity different from that of the doped polysilicon into a portion corresponding to the second drain extension electrode 416b.

As illustrated in FIGS. 4 and 5, a body contact plug 520, a source contact plug 540, and a drain contact plug 560 may be formed, and then a wiring line 600 may be formed, thereby forming a semiconductor device 2 having a power MOS transistor.

Figure 19:
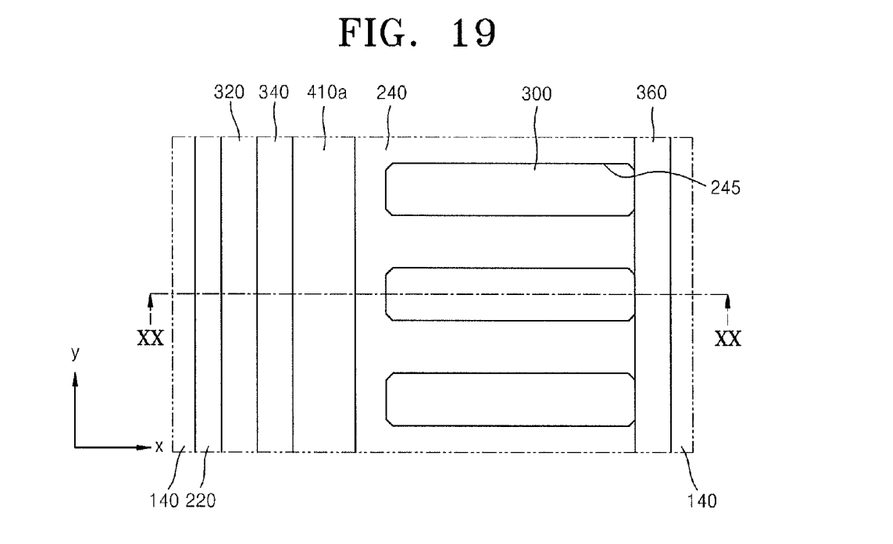
FIGS. 19 and 20 illustrate plan and cross-sectional views for describing an operation of forming a gate electrode, according to another embodiment.
Figure 20:
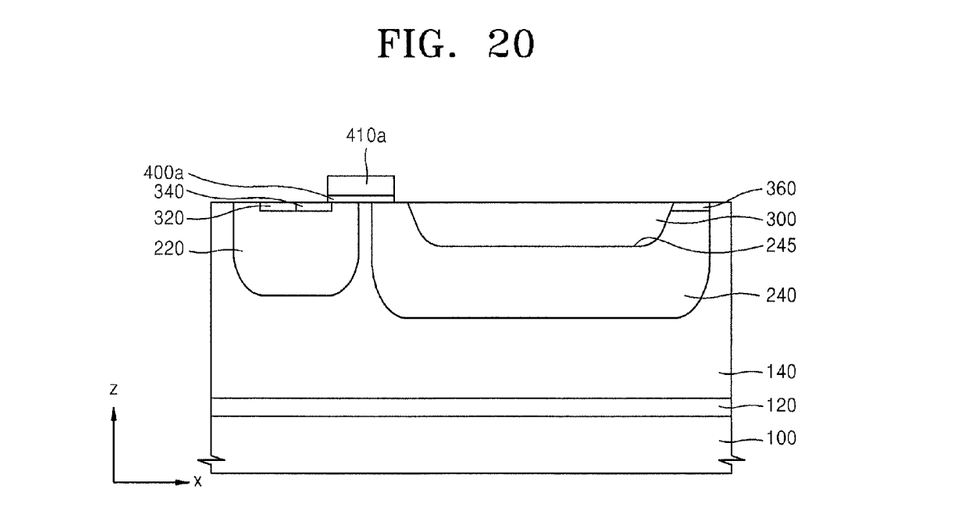

FIGS. 19 and 20 illustrate plan and cross-sectional views for describing an operation of forming a gate electrode 410a, according to another embodiment. In more detail, FIG. 20 is a cross-sectional view cut along a line XX-XX of FIG. 19.

Referring to FIGS. 19 and 20, a gate insulating layer 400a and the gate electrode 410a may be formed to extend from being on the body region 220 to being on the drift region 240 along a second direction (y direction).

As illustrated in FIGS. 6 through 8, a body contact plug 520, a source contact plug 540, a drain contact plug 560, and a drain extension electrode 580 may be formed, and then a wiring line 600a may be formed, thereby forming a semiconductor device 3 having a power MOS transistor. The drain extension electrode 580 may be formed simultaneously with the body contact plug 520 and/or the source contact plug 540 by using the same manufacturing process.

By way of summation and review, if the structure of an existing power MOS transistor that has been formed as a separate device (chip) is applied to an integrated circuit, the reliability of the integrated circuit may be reduced and heat generated by the power MOS transistor may influence the reliability of other individual devices.

A laterally diffused metal-oxide-semiconductor (LDMOS) may have a shallow trench in order to apply the reduced surface field (RESURF) principle. However, due to the shallow trench, current flow paths may be reduced.

Embodiments provide a hybrid of a laterally diffused metal-oxide-semiconductor (LDMOS) and a drain-extended metal-oxide-semiconductor (DEMOS) so as to increase current flow paths and to achieve a high breakdown voltage. Embodiments provide a semiconductor device having a power metal-oxide-semiconductor (MOS) transistor that may minimize heat and improve reliability.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A semiconductor device comprising a power metal-oxide-semiconductor (MOS) transistor, the MOS transistor including:
a semiconductor substrate;
an impurity region on the semiconductor substrate, the impurity region having a first conductivity;
a drift region in the impurity region, the drift region having the first conductivity, at least one recess region being in a portion of an upper surface of the drift region;
a body region in the impurity region adjacent to the drift region, the body region having a second conductivity different from the first conductivity;
a drain extension insulating layer on the drift region, the drain extension insulating layer being a shallow trench insulator (STI) that fills the at least one recess region, an upper surface of the drain extension insulating layer not being higher than an upper surface of the impurity region;
a gate insulating layer and a gate electrode sequentially stacked across a portion of the body region and a portion of the drift region;
a drain extension electrode on the drain extension insulating layer;
a drain region contacting a side of the drift region opposite to the body region, the drain region having the first conductivity; and
a source region in the body region, the source region having the second conductivity.

2. The semiconductor device as claimed in claim 1, wherein
the drain extension insulating layer is between the body region and the drain region.

3. The semiconductor device as claimed in claim 1, further comprising a wiring line on the semiconductor substrate,
wherein the drain extension electrode is a contact plug electrically connected to the wiring line.

4. The semiconductor device as claimed in claim 3, further comprising a source contact plug electrically connecting the wiring line and the source region such that a common bias is provided to the drain extension electrode and the source region.

5. The semiconductor device as claimed in claim 3, further comprising:
a body contact region in the body region and having the second conductivity; and
a body contact plug electrically connecting the wiring line and the body contact region such that a common bias is provided to the drain extension electrode and the body contact region.

6. The semiconductor device as claimed in claim 1, wherein:
the body region, the drift region, and the drain region are arranged along a first direction, and
the drain extension insulating layer extends along the first direction and has a bar-shaped horizontal cross-section with respect to the semiconductor substrate.

7. The semiconductor device as claimed in claim 6, wherein the drain extension insulating layer includes a plurality of drain extension insulating layers spaced apart from each other.

8. The semiconductor device as claimed in claim 7, wherein the plurality of drain extension insulating layers are arranged along a second direction different from the first direction.

9. The semiconductor device as claimed in claim 8, wherein the gate electrode and the drain extension electrode are integrally formed to be electrically connected to each other.

10. The semiconductor device as claimed in claim 9, wherein the drain extension electrode extends from the gate electrode onto each of the plurality of drain extension insulating layers along the first direction in a finger shape.

11. The semiconductor device as claimed in claim 10, wherein:
a first portion of an end portion of the drain extension electrode in the first direction is formed of undoped polysilicon, and a second portion of the end portion of the drain extension electrode is formed of doped polysilicon, or
the first portion of the end portion of the drain extension electrode and the second portion of the end portion of the drain extension electrode are formed of doped polysilicon having different conductivities.

12. The semiconductor, device as claimed in claim 1, further comprising a barrier region in the semiconductor substrate under the impurity region, the barrier region having a carrier density higher than that of the impurity region.

13. The semiconductor device as claimed in claim 1, wherein the drift region has a carrier density higher than that of the impurity region.

14. A semiconductor device comprising a power metal-oxide-semiconductor (MOS) transistor, the MOS transistor including:
- a semiconductor substrate;
- an impurity region on the semiconductor substrate, the impurity region having a first conductivity;
- a drift region in the impurity region, the drift region having the first conductivity;
- a body region in the impurity region adjacent to the drift region, the body region having a second conductivity different from the first conductivity;
- a plurality of recess regions in an upper surface of the drift region, extending from the body region along a first direction toward a drain region, and arranged to be spaced apart from each other along a second direction different from the first direction;
- a source region in the body region, the source region having the second conductivity;
- a drain region contacting a side of the drift region opposite to the body region, the drain region having the first conductivity;
- a plurality of drain extension insulating layers filling the plurality of recess regions, upper surfaces of the plurality of drain extension insulating layers not being higher than an upper surface of the impurity region;
- a gate insulating layer and a gate electrode sequentially stacked on the semiconductor substrate across a portion of the body region and a portion of the drift region; and
- a drain extension electrode on each of the plurality of drain extension insulating layers,
- wherein current flow paths are formed through portions of the drift region between the plurality of drain extension insulating layers and under the plurality of drain extension insulating layers.

15. The semiconductor device as claimed in claim 14, wherein:
- the plurality of drain extension insulating layers are between the body region and the drain region; and
- the gate electrode and the drain extension insulating layers are spaced apart from each other along the first direction.

16. A semiconductor device, comprising:
- a semiconductor substrate;
- an impurity region on the semiconductor substrate, the impurity region having a first conductivity;
- a drift region in the impurity region, the drift region having the first conductivity;
- a body region in the impurity region adjacent to the drift region, the body region having a second conductivity different from the first conductivity;
- a source region in the body region, the source region having the second conductivity;
- a drain region contacting a side of the drift region opposite to the body region, the drain region having the first conductivity, the drift region including a recess in an upper surface of the drift region, and the recess extending in a first direction from the drain region toward the body region;
- a drain extension insulating layer filling the recess of the drift region, an upper surface of the drain extension insulating layer not being higher than an upper surface of the impurity region;
- a gate insulating layer and a gate electrode sequentially stacked across a portion of the body region and a portion of the drift region; and
- a drain extension electrode on an upper surface of the dram extension insulating layer.

17. The semiconductor device as claimed in claim 16, wherein:
- the drain extension insulating layer is between the body region and the drain region; and
- the drain extension electrode on the upper surface of the drain extension insulating layer is spaced apart from boundary portions between the drain extension insulating layer and the drift region on at least three sides of the drain extension electrode.

18. The semiconductor device as claimed in claim 16, wherein the drain extension electrode extends from the gate electrode onto the drain extension insulating layer in a finger shape in the first direction.

19. The semiconductor device as claimed in claim 18, wherein the drain extension electrode includes rounded portions where the drain extension electrode and the gate electrode are connected.

20. The semiconductor device as claimed in claim 19, wherein an end portion of the drain extension electrode extends in the first direction with a narrower width than a remaining portion of the drain extension electrode.

* * * * *